United States Patent
Li et al.

(10) Patent No.: US 11,923,434 B2
(45) Date of Patent: Mar. 5, 2024

(54) SELF-ALIGNED BOTTOM SPACER EPI LAST FLOW FOR VTFET

(71) Applicant: INTERNATIONAL BUSINESS MACHINES CORPORATION, Armonk, NY (US)

(72) Inventors: Tao Li, Slingerlands, NY (US); Ruilong Xie, Niskayuna, NY (US); Sung Dae Suk, Watervliet, NY (US); Heng Wu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 128 days.

(21) Appl. No.: 17/481,461

(22) Filed: Sep. 22, 2021

(65) Prior Publication Data

US 2022/0005935 A1    Jan. 6, 2022

Related U.S. Application Data

(62) Division of application No. 16/743,323, filed on Jan. 15, 2020, now Pat. No. 11,177,367.

(51) Int. Cl.
*H01L 21/8234* (2006.01)
*H01L 21/3065* (2006.01)
(Continued)

(52) U.S. Cl.
CPC ...... *H01L 29/6656* (2013.01); *H01L 21/3065* (2013.01); *H01L 21/76224* (2013.01);
(Continued)

(58) Field of Classification Search
CPC ..... H01L 21/823487; H01L 21/823885; H01L 21/823814; H01L 21/823418;
(Continued)

(56) References Cited

U.S. PATENT DOCUMENTS 9,437,503 B1    9/2016  Mallela et al.
9,536,793 B1 *  1/2017  Zhang ............. H01L 21/823864
(Continued)

OTHER PUBLICATIONS

List of IBM Patents or Patent Applications Treated as Related dated Sep. 22, 2021, 2 pages.

*Primary Examiner* — Michael M Trinh
(74) *Attorney, Agent, or Firm* — Tutunjian & Bitetto, P.C.; Samuel Waldbaum

(57) ABSTRACT

A method is presented for forming a vertical transport field effect transistor (VTFET). The method includes forming a plurality of fins over a substrate, depositing a sacrificial material adjacent the plurality of fins, forming self-aligned spacers adjacent the plurality of fins, removing the sacrificial material to define openings under the self-aligned spacers, filling the openings with bottom spacers, depositing an interlayer dielectric (ILD) after patterning, laterally etching the substrate such that bottom surfaces of the plurality of fins are exposed, the lateral etching defining cavities within the substrate, and filling the cavities with an epitaxial material such that epitaxial regions are defined each having a symmetric tapered shape under a twin-fin structure. The single fin device can be formed through additional patterning and bottom epi under the single fin device that has an asymmetric tapered shape.

20 Claims, 11 Drawing Sheets

(51) Int. Cl.
*H01L 21/762* (2006.01)
*H01L 27/088* (2006.01)
*H01L 29/08* (2006.01)
*H01L 29/10* (2006.01)
*H01L 29/66* (2006.01)
*H01L 29/78* (2006.01)

(52) U.S. Cl.
CPC ............... *H01L 21/823481* (2013.01); *H01L 21/823487* (2013.01); *H01L 27/088* (2013.01); *H01L 29/0847* (2013.01); *H01L 29/1037* (2013.01); *H01L 29/7827* (2013.01)

(58) Field of Classification Search
CPC ..... H01L 21/823425; H01L 21/823481; H01L 21/823878; H01L 29/1037; H01L 29/7827; H01L 29/66666; H01L 29/0847; H01L 27/088; H01L 27/092
See application file for complete search history.

(56) References Cited

U.S. PATENT DOCUMENTS

| | | | |
|---|---|---|---|
| 10,014,391 B2 | 7/2018 | Bergendahl et al. | |
| 10,083,871 B2 | 9/2018 | Cheng et al. | |
| 10,199,480 B2 | 2/2019 | Xie et al. | |
| 10,211,302 B2 | 2/2019 | Cheng et al. | |
| 10,211,315 B2 | 2/2019 | Zang et al. | |
| 10,263,122 B1 | 4/2019 | Zang et al. | |
| 2016/0020210 A1* | 1/2016 | Liaw | H01L 21/30604 257/369 |
| 2017/0352742 A1* | 12/2017 | Cheng | H01L 29/0657 |
| 2018/0019337 A1 | 1/2018 | Xie et al. | |
| 2018/0053758 A1* | 2/2018 | Cheng | H01L 21/823487 |
| 2018/0294192 A1 | 10/2018 | Bao | H01L 27/088 |
| 2018/0323281 A1* | 11/2018 | Cheng | H01L 21/823481 |
| 2018/0350951 A1 | 12/2018 | Yamashita et al. | |
| 2019/0051563 A1 | 2/2019 | Park et al. | |
| 2019/0097016 A1 | 3/2019 | Alptekin et al. | |
| 2019/0140080 A1 | 5/2019 | Lee et al. | |
| 2020/0035565 A1* | 1/2020 | Zhang | H01L 22/14 |
| 2020/0126989 A1* | 4/2020 | Liaw | H01L 27/0207 |
| 2021/0057568 A1* | 2/2021 | Xie | H01L 29/0847 |
| 2021/0098466 A1* | 4/2021 | Liaw | H01L 27/0207 |
| 2021/0210631 A1* | 7/2021 | Yeh | H01L 29/0692 |

* cited by examiner

SELF-ALIGNED BOTTOM SPACER EPI LAST FLOW FOR VTFET

BACKGROUND

The present invention relates generally to semiconductor devices, and more specifically, to a self-aligned bottom spacer epi last flow for vertical transport field effect transistors (VTFETs).

Stacking field-effect transistors (FETs) in a vertical direction gives an additional dimension for complementary metal-oxide-semiconductor (CMOS) area scaling. However, it is challenging to stack planar FETs. Vertical field effect transistors (VFETs), however, have a unique structure that can help the stacking process. Namely, as opposed to planar CMOS devices, VFETs are oriented with a vertical fin channel disposed on a bottom source/drain and a top source/drain disposed on the fin channel.

Moreover, vertical transport field-effect transistor (VT-FETs) are considered viable candidates for next generation CMOS building blocks in integrated circuit fabrication. By comparison with traditional finFETs, a VTFET has a current flow vertically from a bottom to a top of a vertical fin channel, with a control gate wrapped around the vertical fin channel for turning the transistor on and off.

SUMMARY

In accordance with an embodiment, a method is provided for forming a vertical transport field effect transistor (VTFET). The method includes forming a plurality of fins over a substrate, depositing a sacrificial material adjacent the plurality of fins, forming self-aligned spacers adjacent the plurality of fins, removing the sacrificial material to define openings under the self-aligned spacers, filling the openings with bottom spacers, depositing an interlayer dielectric (ILD) after patterning, laterally etching the substrate such that bottom surfaces of the plurality of fins are exposed, the lateral etching defining cavities within the substrate, and filling the cavities with an epitaxial material such that epitaxial regions are defined each having a symmetric tapered shape under a twin-fin structure.

In accordance with another embodiment, a method is provided for forming a vertical transport field effect transistor (VTFET). The method includes forming a plurality of fins over a substrate, depositing a sacrificial material adjacent the plurality of fins, forming self-aligned spacers adjacent the plurality of fins, removing the sacrificial material to define openings under the self-aligned spacers, filling the openings with bottom spacers, depositing an interlayer dielectric (ILD) after patterning, laterally etching the substrate such that bottom surfaces of the plurality of fins are exposed, the lateral etching defining cavities within the substrate, filling the cavities with an epitaxial material such that epitaxial regions are defined each having a symmetric tapered shape under a twin-fin structure, and performing further patterning to separate the twin-fin structure into two single fin devices, the separation involving splitting an epitaxial region into two asymmetric epitaxial regions via a trench filled with a dielectric.

In accordance with yet another embodiment, a semiconductor structure is provided for forming a vertical transport field effect transistor (VTFET). The semiconductor structure includes a twin-fin structure directly contacting a first epitaxial region and single fin structures each directly contacting second epitaxial regions, wherein the first epitaxial region defines a symmetric tapered shaped within a substrate and the second epitaxial regions each define an asymmetric tapered shape within the substrate.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for forming vertical transistor field effect transistors (VTFETs) having a self-aligned uniform bottom spacer with a bottom epitaxial region that is directly under the fin channel, the bottom epitaxial region having an asymmetric tapered shape under single fin device.

Examples of semiconductor materials that can be employed in forming such structures include silicon (Si), germanium (Ge), silicon germanium alloys (SiGe), carbon doped silicon (Si:C), carbon doped silicon germanium carbide (SiGe:C), phosphorous doped silicon (Si:P), boride doped silicon germanium (SiGe:B), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
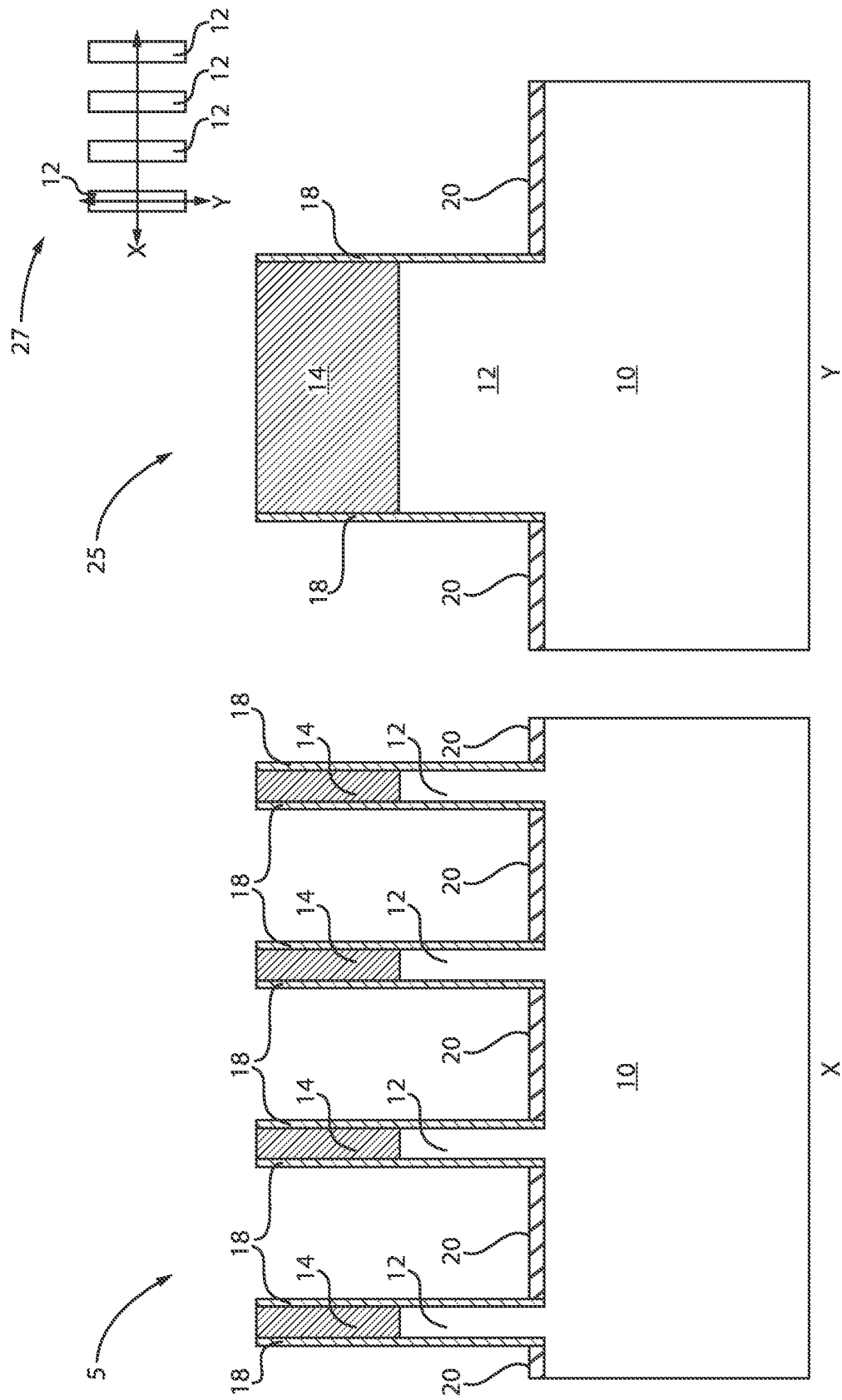
FIG. 1 is a cross-sectional view of a semiconductor structure including a plurality of fins and a sacrificial layer formed adjacent the plurality of fins, in accordance with an embodiment of the present invention.

FIG. 1 is a cross-sectional view of a semiconductor structure including a plurality of fins and a sacrificial layer formed adjacent the plurality of fins, in accordance with an embodiment of the present invention.

In structures 5 and 25, a plurality of fins 12 can be formed over a substrate 10. A hardmask 14 can be formed over and in direct contact with the plurality of fins 12. Liners 18 can be formed adjacent the plurality of fins 12 and the hardmasks 14. A sacrificial material 20 can be selectively grown between the plurality of fins 12. The sacrificial material 20 directly contacts a top surface of the substrate 10 and directly contacts sidewalls of the liners 18.

Structure 5 is a cross-sectional view taken along line X of top view 27, whereas structure 25 is a cross-sectional view taken along line Y of top view 27.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers. In some embodiments, the substrate 10 includes a semiconductor material including, but not necessarily limited to, silicon (Si), silicon germanium (SiGe), Si:C (carbon doped silicon), carbon doped silicon germanium (SiGe:C), III-V (e.g., GaAs, AlGaAs, InAs, InP, etc.), II-VI compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials.

Materials for the sacrificial material 20 include, but are not limited to, any one or more of amorphous or polycrystalline Si, $SiO_2$, SiON, SiGe, Ge, $GeO_2$, amorphous C, BC, CN, etc. In one example, the sacrificial material 20 can be, e.g., SiGe.

The hardmask 14 materials can include any of one or more of SiN, SiCN, SiBN and/or SiBCN, among other materials. The hardmask layer 14 can be an oxide, for example, a silicon oxide hardmask. The hardmask layer 14 can be patterned by any suitable patterning techniques, including but not limited to, lithography followed by etching, sidewall image transfer (SIT), self-aligned double patterning (SADP), self-aligned multiple patterning (SAMP), self-aligned quadruple patterning (SAQP), or any suitable combination of those techniques.

In one or more embodiments, the hardmask layer 14 can have a thickness in the range of about 20 nm to about 100 nm, or in the range of about 35 nm to about 75 nm, or in the range of about 45 nm to about 55 nm, although other thicknesses are contemplated.

Liners 18 can include any of one or more of SiN, SiBN, SiCN and/or SiBCN films.

In another example embodiment, the liner 18 can be e.g., silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, and combinations thereof. The liner 18 can be a low-k material having a dielectric constant of less than about 7, or of less than about 5.

The fins 12 can be formed from a semiconductor material including, but not limited to Si, strained Si, Si:C, SiGe, SiGe:C, Si alloys, Ge, Ge alloys, GaAs, InAs, InP, as well as other III/V and II/VI compound semiconductors. The fins 12 can be etched by employing, e.g., a reactive ion etch (RIE) or the like.

Figure 2:
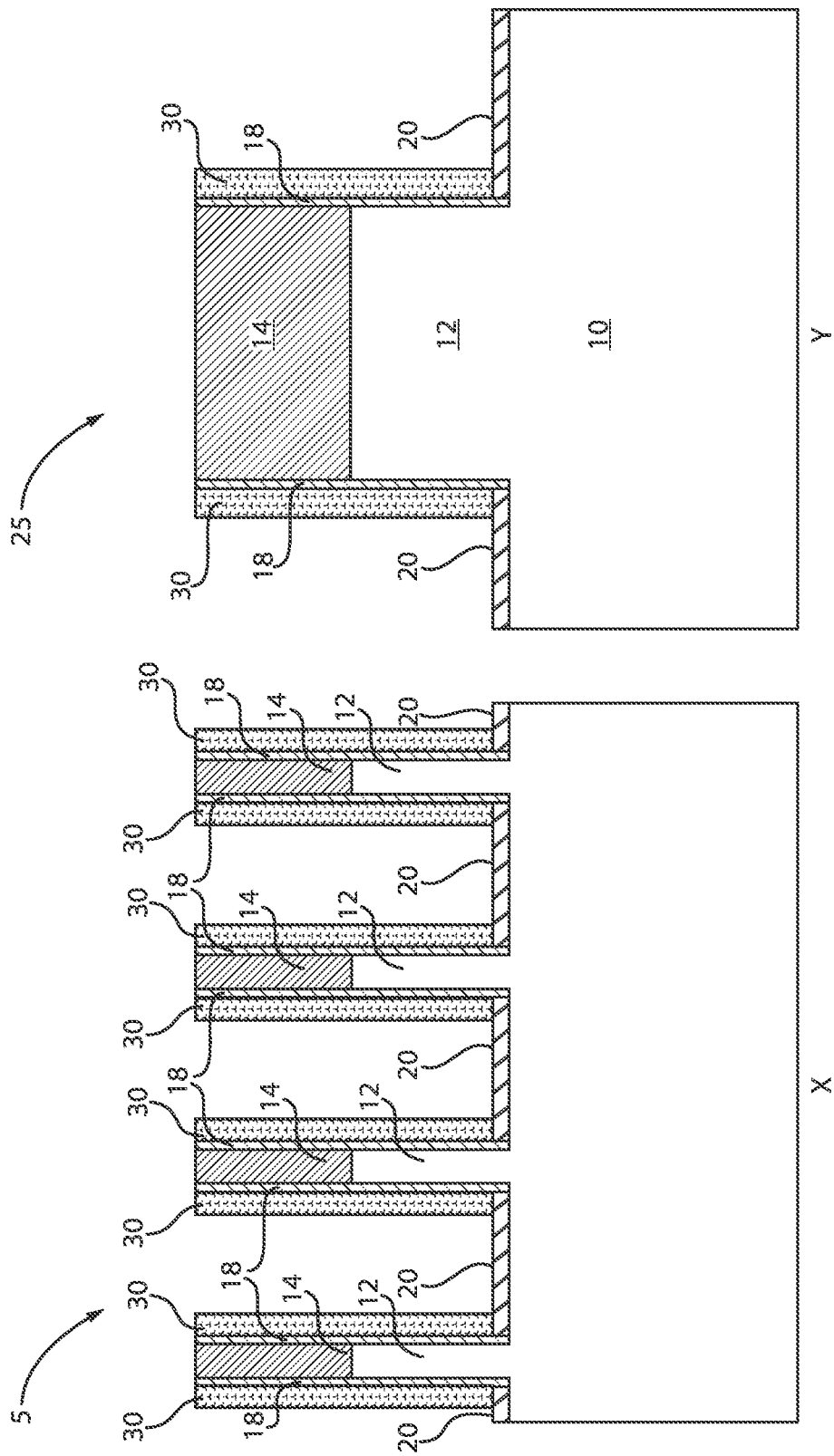
FIG. 2 is a cross-sectional view of the semiconductor structure of FIG. 1 where self-aligned spacers are formed adjacent the plurality of fins, in accordance with an embodiment of the present invention.

FIG. 2 is a cross-sectional view of the semiconductor structure of FIG. 1 where self-aligned spacers are formed adjacent the plurality of fins, in accordance with an embodiment of the present invention.

In various example embodiments, spacers 30 are formed adjacent the plurality of fins 12, as well as adjacent the hardmasks 14. The spacers 30 can include any of one or more of SiN, SiBN, SiCN and/or SiBCN films. The spacers 30 can be referred to as self-aligned spacers. The self-aligned spacers 30 can be referred to as self-aligned active (RX) spacers.

The self-aligned spacers 30 directly contact portions of a top surface of the sacrificial material 20.

Figure 3:
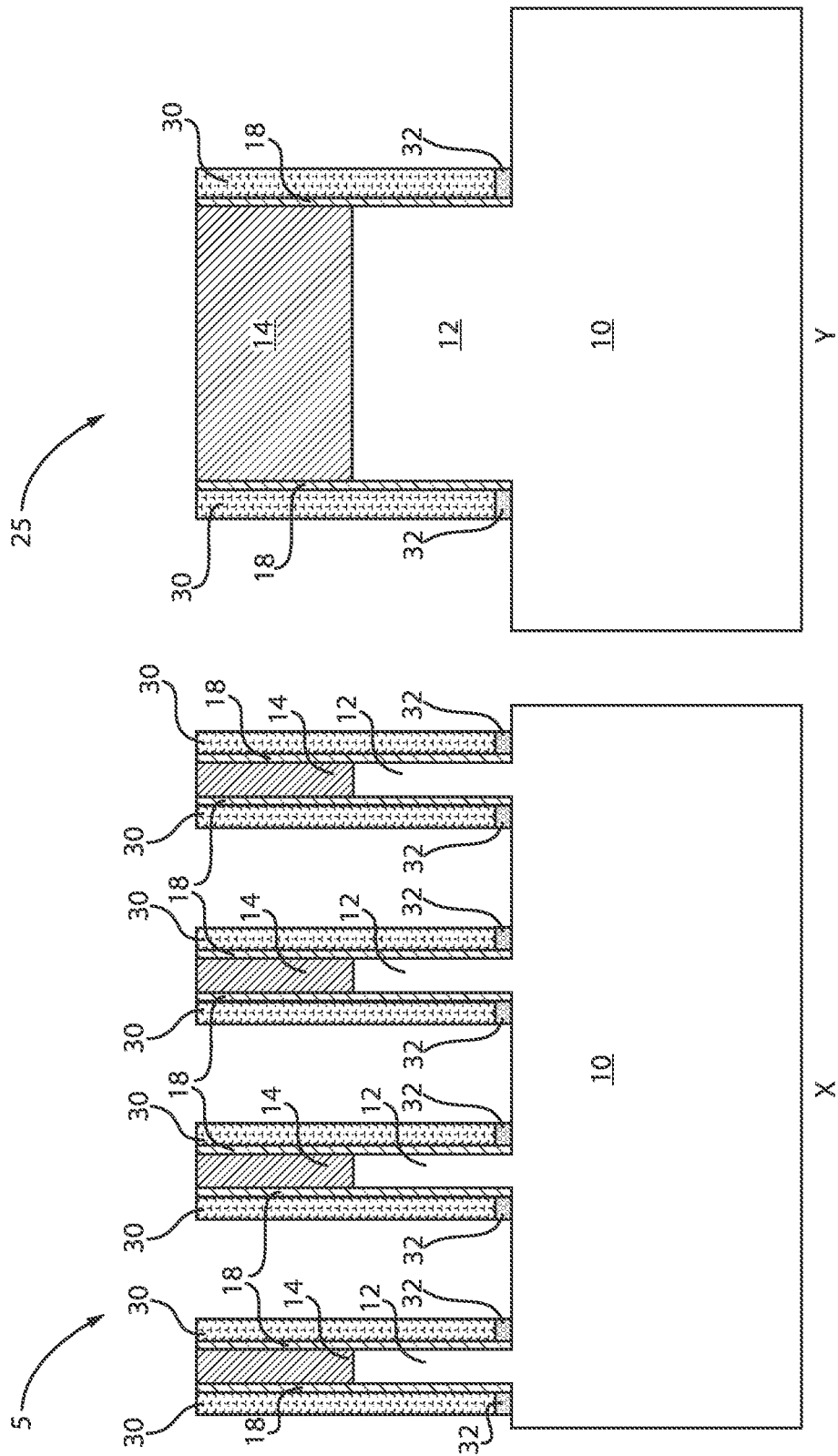
FIG. 3 is a cross-sectional view of the semiconductor structure of FIG. 2 where the sacrificial layer is removed and a bottom spacer is formed underneath the self-aligned spacers, in accordance with an embodiment of the present invention.

FIG. 3 is a cross-sectional view of the semiconductor structure of FIG. 2 where the sacrificial layer is removed and a bottom spacer is formed underneath the self-aligned spacers, in accordance with an embodiment of the present invention.

In various example embodiments, the sacrificial material 20 is removed such that openings are formed underneath the self-aligned spacers 30. The openings are filled with a bottom spacer 32.

Bottom spacers 32 can include a low-k dielectric formed according to known processes. The term "low k dielectric" generally refers to an insulating material having a dielectric constant less than silicon dioxide, i.e., less than 3.9. Exemplary low k dielectric materials include, but are not limited to, dielectric nitrides (e.g., silicon nitride, SiBCN), dielectric oxynitrides (e.g., SiOCN), or any combination thereof or the like. In one example, bottom spacers 32 can be composed of any one or more of SiN, SiBN, SiCN and/or SiBCN films.

In another example, the bottom spacers 32 can include, but are not limited to, silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, silicon nitride, silicon oxynitride, silicon borocarbonitride (SiBCN) or any combination thereof.

Figure 4:
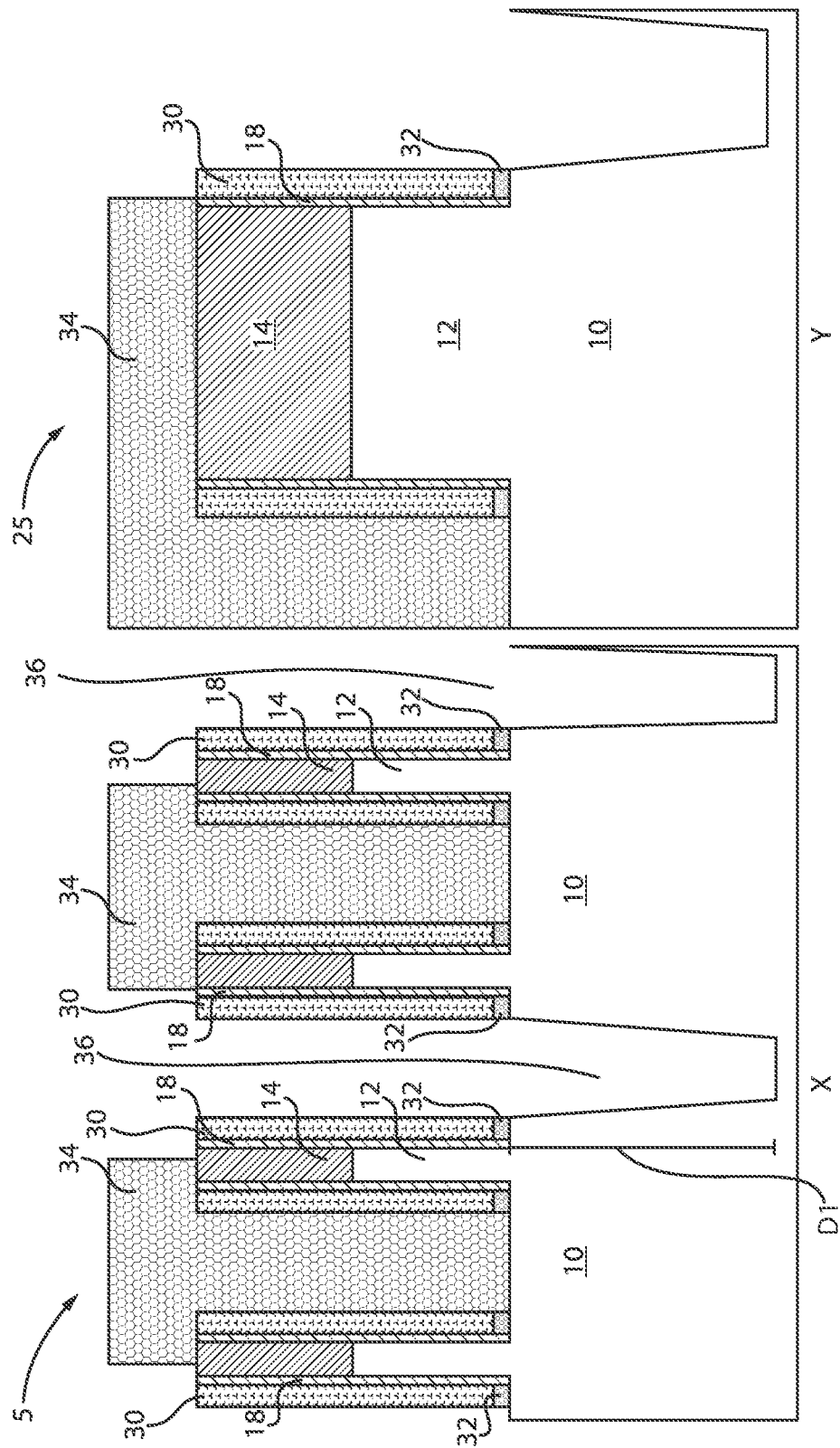
FIG. 4 is a cross-sectional view of the semiconductor structure of FIG. 3 where an organic planarization layer (OPL) is deposited and patterning is performed, in accordance with an embodiment of the present invention.

FIG. 4 is a cross-sectional view of the semiconductor structure of FIG. 3 where an organic planarization layer (OPL) is deposited and patterning is performed, in accordance with an embodiment of the present invention.

In various example embodiments, an OPL 34 is deposited and patterned such that trenches 36 are formed. The trenches 36 extend a distance D1 into the substrate 10. The trenches 36 aid in defining pairs of fins. For example, a first set of fins can be defined on the left-hand side of the structure 5 and a second set of fins can be defined on the right-hand side of the structure 5.

The OPL layer 34 is formed at a predetermined thickness to provide reflectivity and topography control during etching of the hard mask layers below. The OPL layer 34 can include an organic material, such as a polymer. The thickness of the OPL 34 can be in a range from about 50 nm to about 300 nm.

Figure 5:
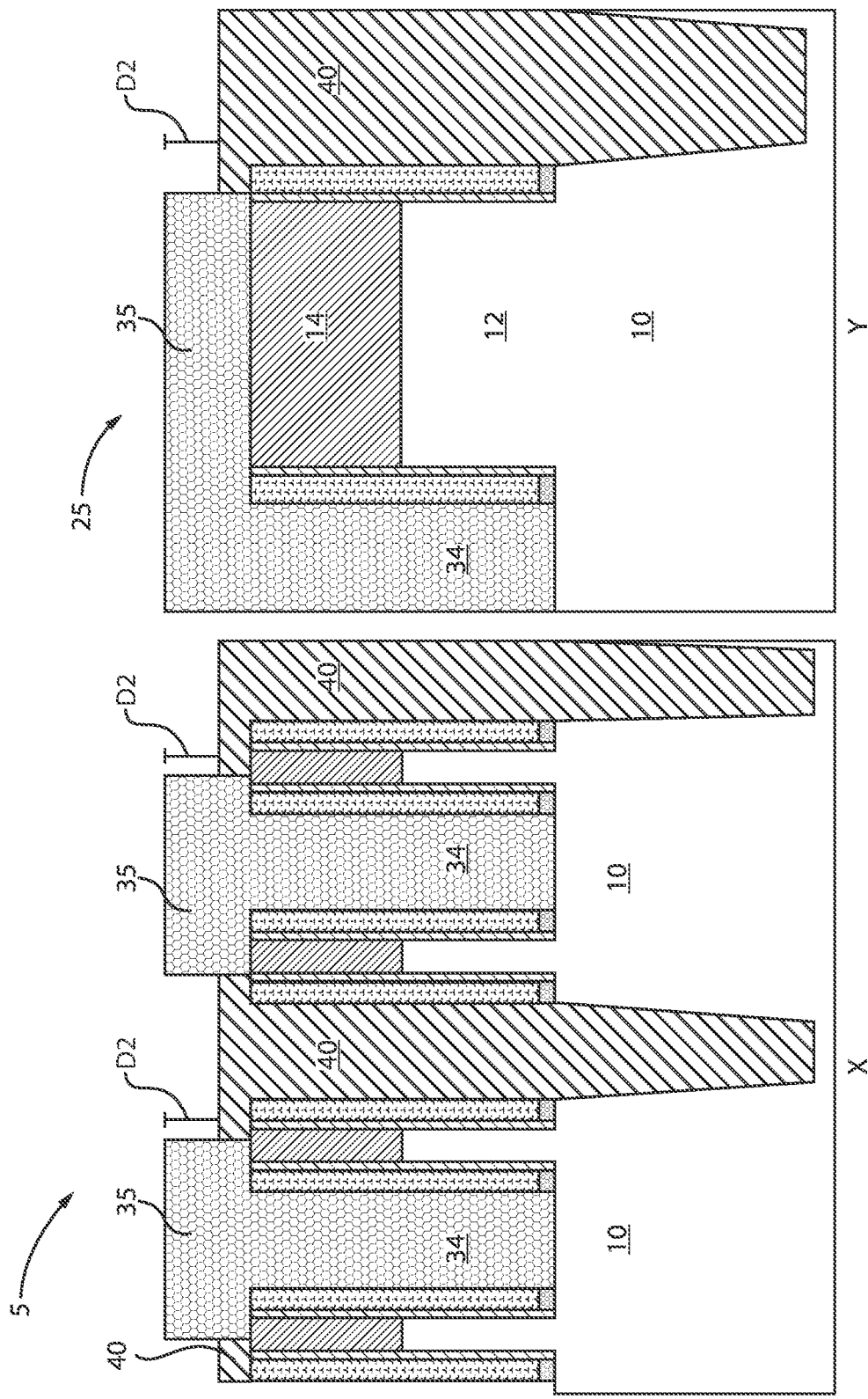
FIG. 5 is a cross-sectional view of the semiconductor structure of FIG. 4 where an interlayer dielectric (ILD) is deposited and recessed to expose upper portions of the OPL, in accordance with an embodiment of the present invention.

FIG. 5 is a cross-sectional view of the semiconductor structure of FIG. 4 where an interlayer dielectric (ILD) is deposited and recessed to expose upper portions of the OPL, in accordance with an embodiment of the present invention.

In various example embodiments, an interlayer dielectric (ILD) 40 is deposited. The ILD 40 fills the trenches 36 and directly contacts upper portions of the OPL 34. The ILD 40 is recessed such that top or upper sections 35 of the OPL 34 are exposed. A distance between the upper sections 35 of the OPL 34 and an upper surface of the ILD 40 can be a distance D2. Thus, the OPL 34 extends above the upper surface of the ILD 40.

The ILD 40 can include any materials known in the art, such as, for example, porous silicates, carbon doped oxides, silicon dioxides, silicon nitrides, silicon oxynitrides, or other dielectric materials. In one example, the ILD 40 can be, e.g., a 30 nm low temperature oxide (LTO). The ILD 40 can be formed using any method known in the art, such as, for example, chemical vapor deposition, plasma enhanced chemical vapor deposition, atomic layer deposition, or physical vapor deposition.

The planarizing process can include chemical mechanical polishing (CMP) followed by an etch process. Therefore, the planarization process can be provided by CMP. Other planarization processes can include grinding and polishing.

Recessing can be performed by, e.g., dry etch processing. In one example, a dry etch can be employed, such as, but not limited to, a directional reactive ion etch (RIE) process with chemistry such as chlorine gas ($Cl_2$)+hydrogen bromide (HBr)+argon (Ar)+oxygen gas ($O_2$).

Figure 6:
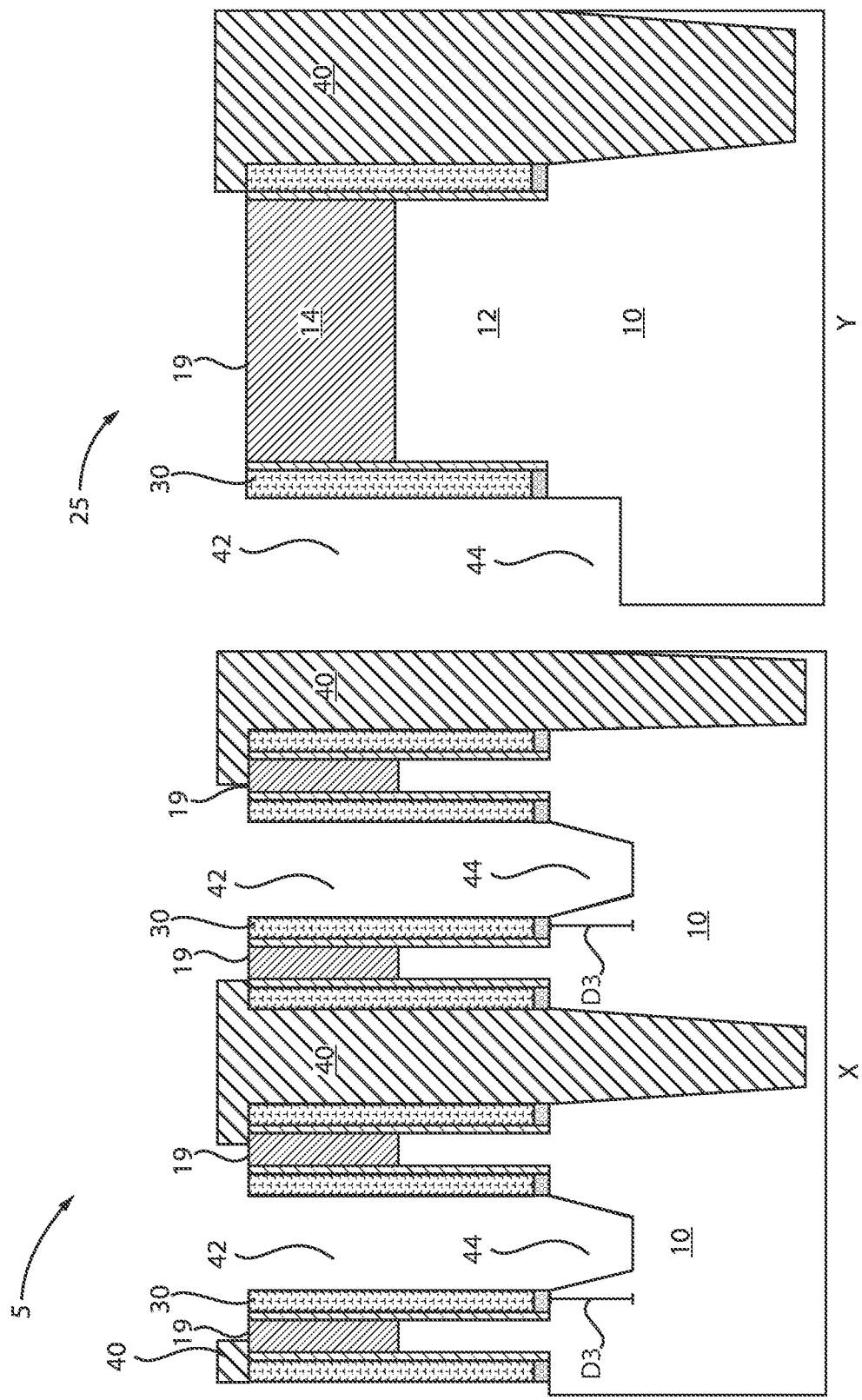
FIG. 6 is a cross-sectional view of the semiconductor structure of FIG. 5 where the OPL is removed and recesses are selectively formed between the plurality of fins, in accordance with an embodiment of the present invention.

FIG. 6 is a cross-sectional view of the semiconductor structure of FIG. 5 where the OPL is removed and recesses are selectively formed between the plurality of fins, in accordance with an embodiment of the present invention.

In various example embodiments, the OPL 34 is completely removed to form opening 42 between the self-aligned spacers 30 and trenches 44 are formed within the substrate 10. The trenches 44 extend a distance D3 into the substrate 10. A partial top surface 19 of the hardmask 14 is also exposed.

Figure 7:
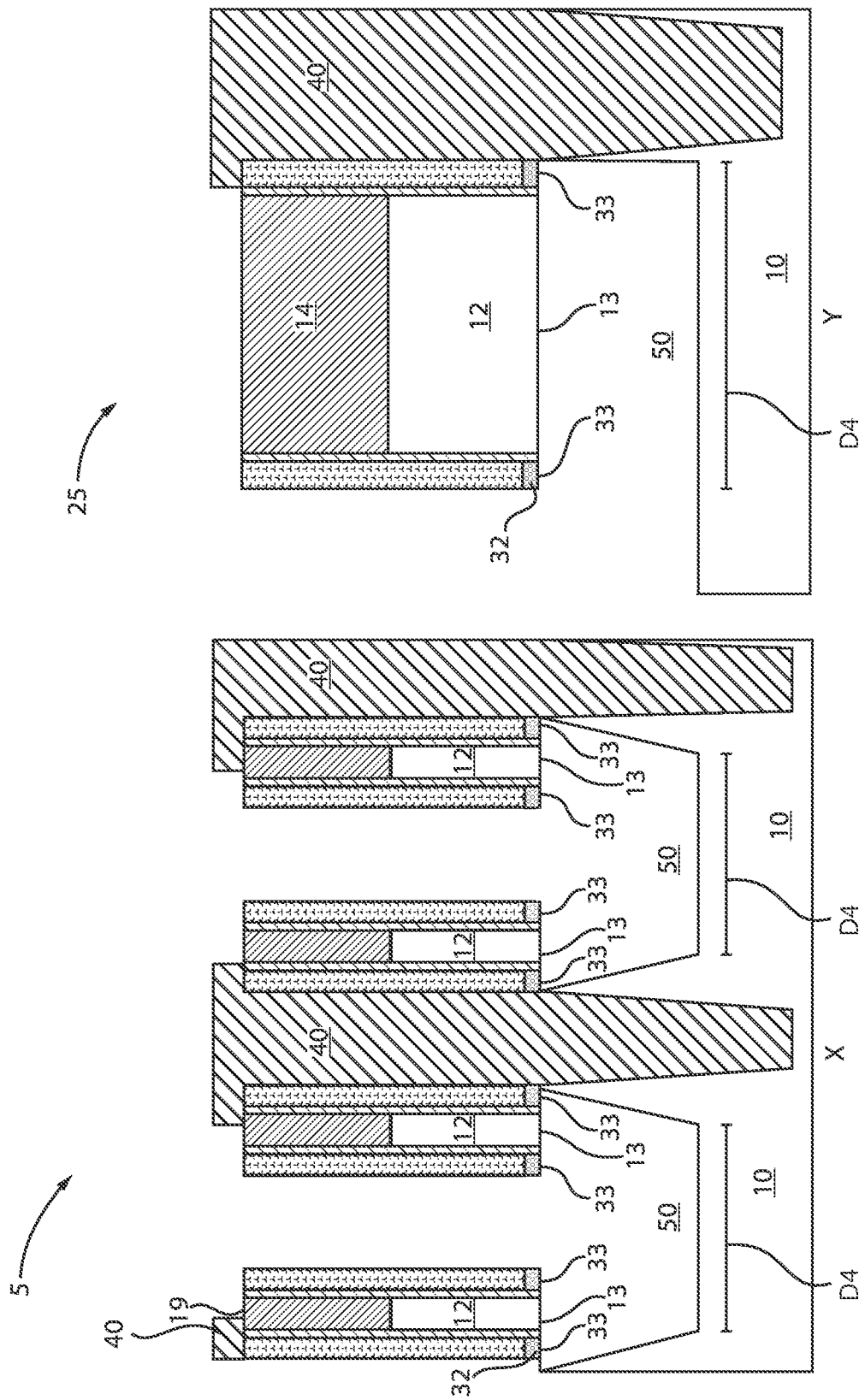
FIG. 7 is a cross-sectional view of the semiconductor structure of FIG. 6 where a lateral fin etch takes place to expose bottom surfaces of the plurality of fins, in accordance with an embodiment of the present invention.

FIG. 7 is a cross-sectional view of the semiconductor structure of FIG. 6 where a lateral fin etch takes place to expose bottom surfaces of the plurality of fins, in accordance with an embodiment of the present invention.

In various example embodiments, a lateral fin etch takes place to expose bottom surfaces 13 of the plurality of fins 12. The lateral etch creates openings or cavities 50. The openings 50 result in the exposure of bottom surfaces 33 of bottom spacers 32, as well as bottom surfaces 13 of the plurality of fins 12. The openings 50 extend a horizontal distance D4 within the substrate 10. The lateral etch exposes the bottom surfaces 13 of all of the plurality of fins 12, as well as all the bottom surfaces 33 of all of the bottom spacers 32. The openings 50 can define a symmetric shape. In other words, the silicon (Si) cavity shape and epi shape under the twin fins are symmetric. When additional patterning is done between two fins (FIGS. 9-11), the symmetric epi under the twin fin will be etched, and, thus, an asymmetric epi shape is created.

Figure 8:
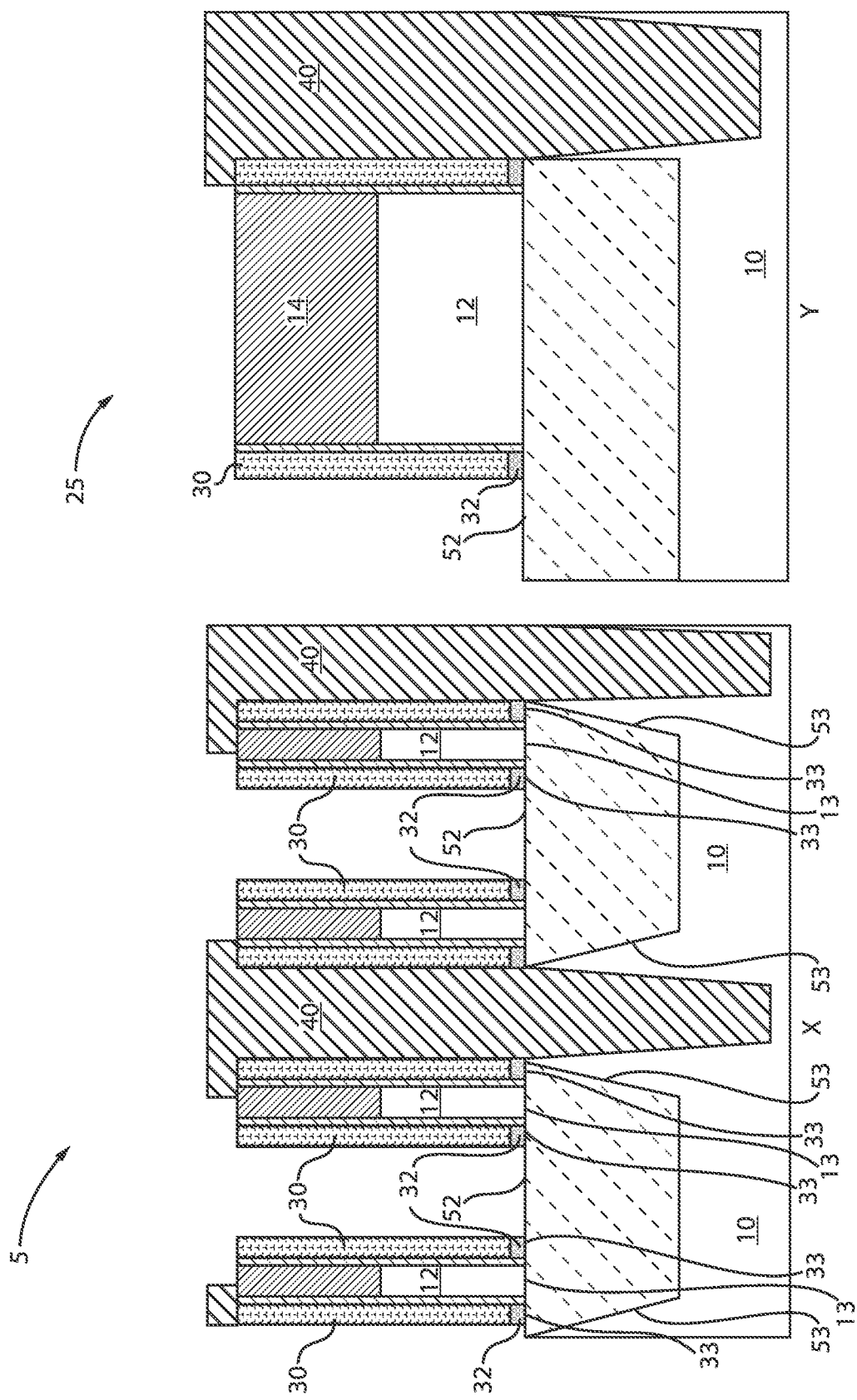
FIG. 8 is a cross-sectional view of the semiconductor structure of FIG. 7 where a bottom epi is formed, in accordance with an embodiment of the present invention.

FIG. 8 is a cross-sectional view of the semiconductor structure of FIG. 7 where a bottom epi is formed, in accordance with an embodiment of the present invention.

In various example embodiments, a bottom epi 52 is formed within the openings 50. Thus, the bottom epi 52 directly contacts the bottom surfaces 13 of all of the plurality of fins 12 and the bottom surfaces 33 of all of the bottom spacers 32. The bottom epi 52 can be referred to as bottom epitaxial regions 52.

In the exemplary embodiment, two epitaxial regions 52 are illustrated. The first epitaxial region 52 directly contacts a first pair of fins (left-hand side) and the second epitaxial region 52 directly contacts a second pair of fins (right-hand side). In the exemplary embodiments, for illustration purposes only, the first set of fins is a first pair of fins and the second set of fins is a second pair of fins. Side walls or side surfaces 53 are further defined and described below in detail.

Generally, epitaxial growth, deposition, formation, etc. means the growth of a semiconductor material on a deposition or seed surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor material with sufficient energy to move around on the surface and orient themselves to the crystal arrangement of the atoms of the deposition surface. Therefore, an epitaxial material has the same crystalline characteristics as the deposition surface on which it is formed. For example, an epitaxial material deposited on a <100> crystal surface will take on a <100> orientation.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and can be conducted at higher or lower temperatures as needed.

Figure 9:
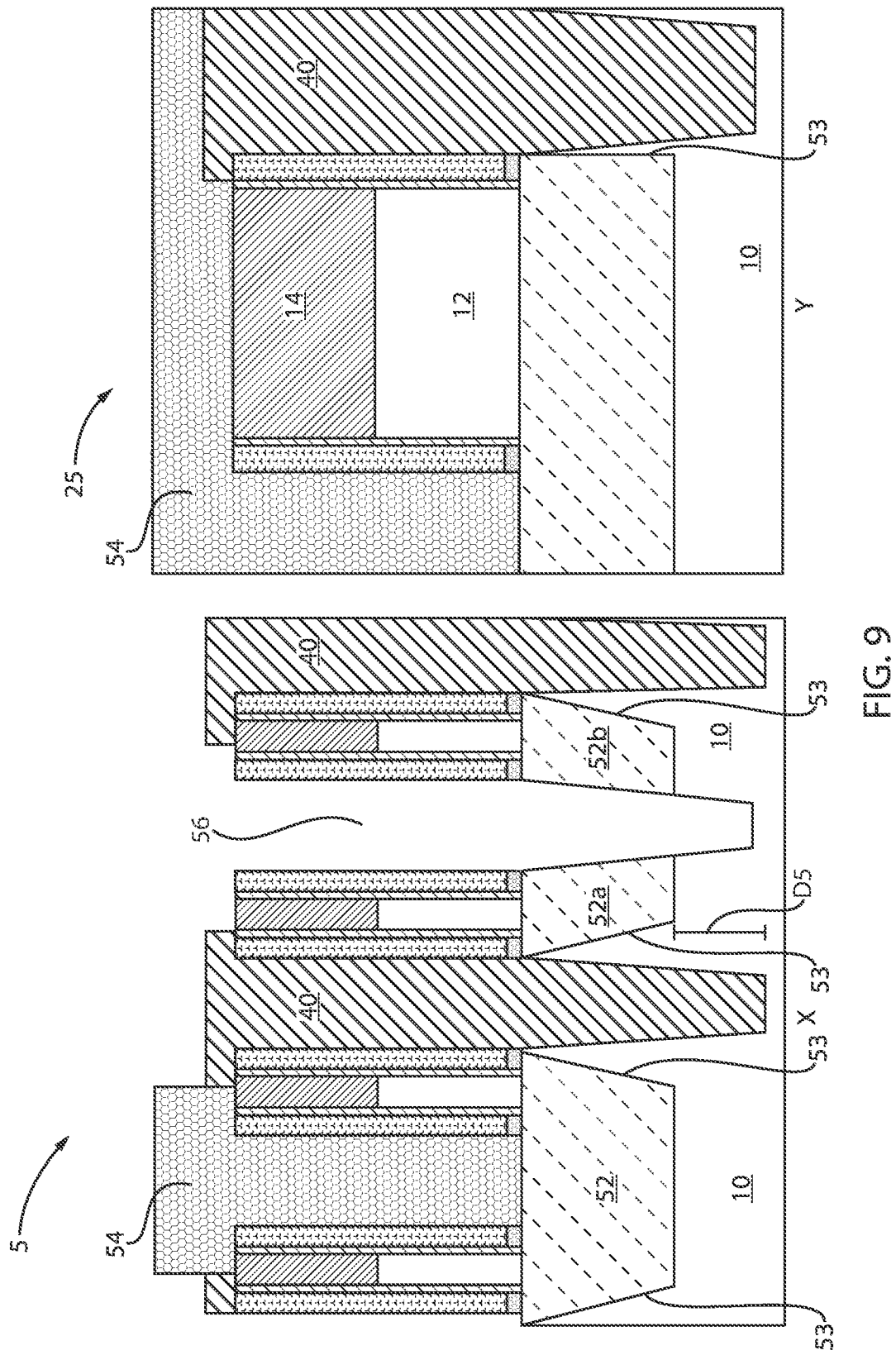
FIG. 9 is a cross-sectional view of the semiconductor structure of FIG. 8 where an OPL is deposited and patterned over at least one bottom epi and a trench is formed within at least another bottom epi, in accordance with an embodiment of the present invention.

FIG. 9 is a cross-sectional view of the semiconductor structure of FIG. 8 where an OPL is deposited over at least one bottom epi and a trench is formed within at least another bottom epi, in accordance with an embodiment of the present invention.

In various example embodiments, an OPL 54 is deposited over, e.g., one bottom epitaxial region 52 and a trench 56 is formed through, e.g., another bottom epitaxial region 52. The trench 56 extends a distance D5 into the substrate 10. The OPL 54 is deposited in order to perform further patterning. Therefore, the first epitaxial region 52 (left-hand side) remains intact, whereas the second epitaxial region 52 (right-hand side) is split into two sections. The first section 52A directly contacts one fin of the pair of fins and the second section 52B directly contacts the other fin of the pair of fins. The sidewall 53 of the epitaxial section 52A can have a negative taper angle, whereas the sidewall 53 of the epitaxial section 52B can have a positive taper angle. Thus, the trench 56 separates or divides or splits the epitaxial region 52 (right-hand side) into two epitaxial sections 52A, 52B resulting in splitting the pair of fins on the right-hand side.

Figure 10:
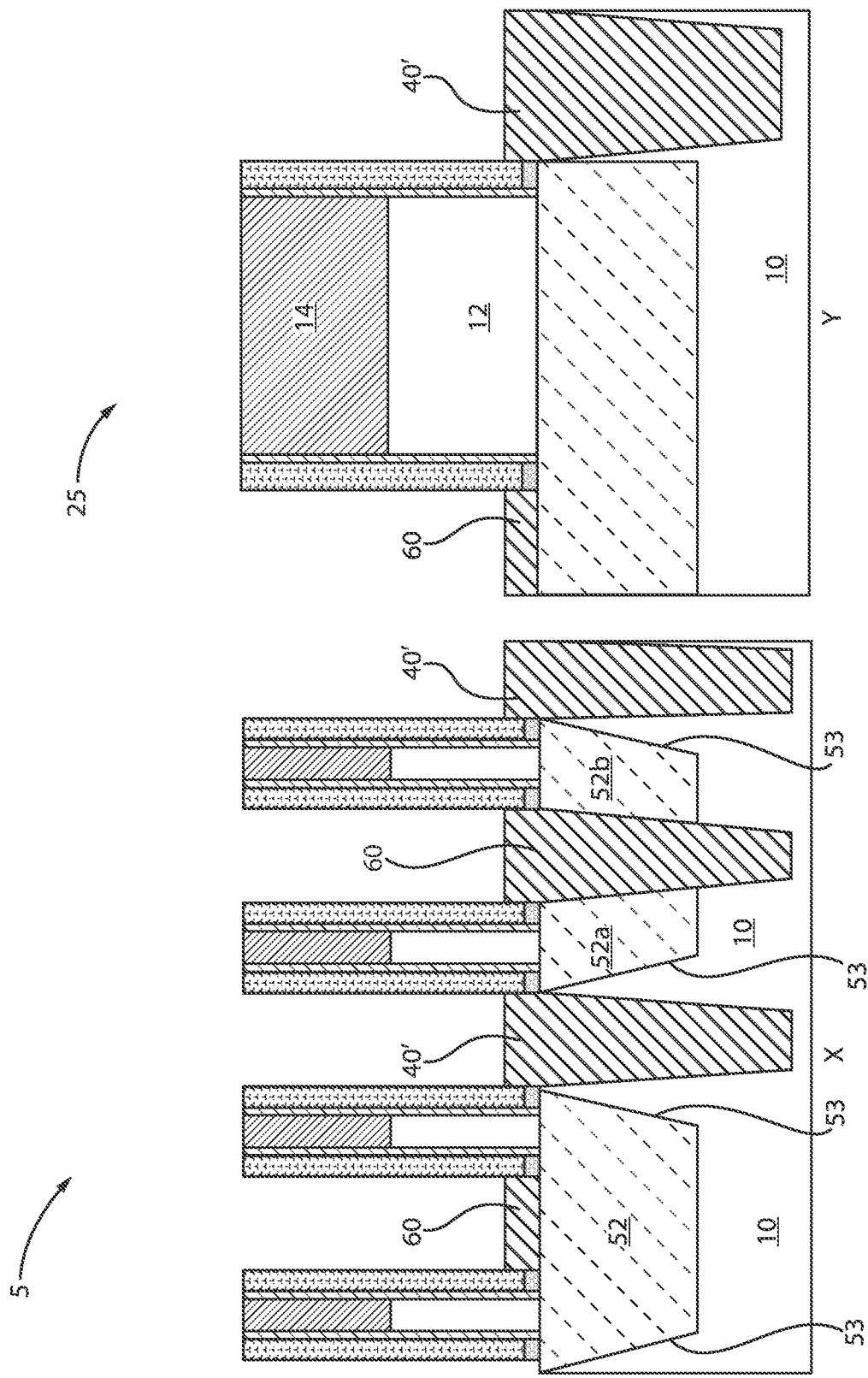
FIG. 10 is a cross-sectional view of the semiconductor structure of FIG. 9 where the OPL is removed and a dielectric is deposited, planarized, and recessed, in accordance with an embodiment of the present invention.

FIG. 10 is a cross-sectional view of the semiconductor structure of FIG. 9 where the OPL is removed and a dielectric is deposited, planarized, and recessed, in accordance with an embodiment of the present invention.

In various example embodiments, the OPL 54 is removed by, e.g. a dry etching process, such as ashing. Ashing is performed using a suitable reaction gas, for example, $O_2$, $N_2$, $H_2/N_2$, $O_3$, $CF_4$, or any combination thereof. The dry etching process can be combined with a wet etching process. The wet etching process can be performed, for example, with a wet etchant, such as sulfuric acid and hydrogen peroxide.

After removal of the OPL 54, a dielectric 60 is deposited. The dielectric 60 is planarized and recessed such that dielectric 60 remains over the bottom epi 52 and within the trench 56. The planarizing process can include chemical mechanical polishing (CMP) followed by an etch process. Therefore, the planarization process can be provided by CMP. Other planarization processes can include grinding and polishing. Additionally, the ILD 40 is etched such that ILD portions 40' remain between the bottom epi regions 52. The ILD portions 40' can be referred to as shallow trench isolation (STI) regions. An STI region 40' separates the epitaxial region 52 from the first and second epitaxial regions 52A, 52B.

The dielectric 60 can be any suitable dielectric such as, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), or any suitable combination of those materials. In one example, the dielectric 60 is SiOC.

In some embodiments, the dielectric layer 60 can be conformally deposited using atomic layer deposition (ALD) or, chemical vapor deposition (CVD). Variations of CVD processes suitable for forming the dielectric 60 include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Figure 11:
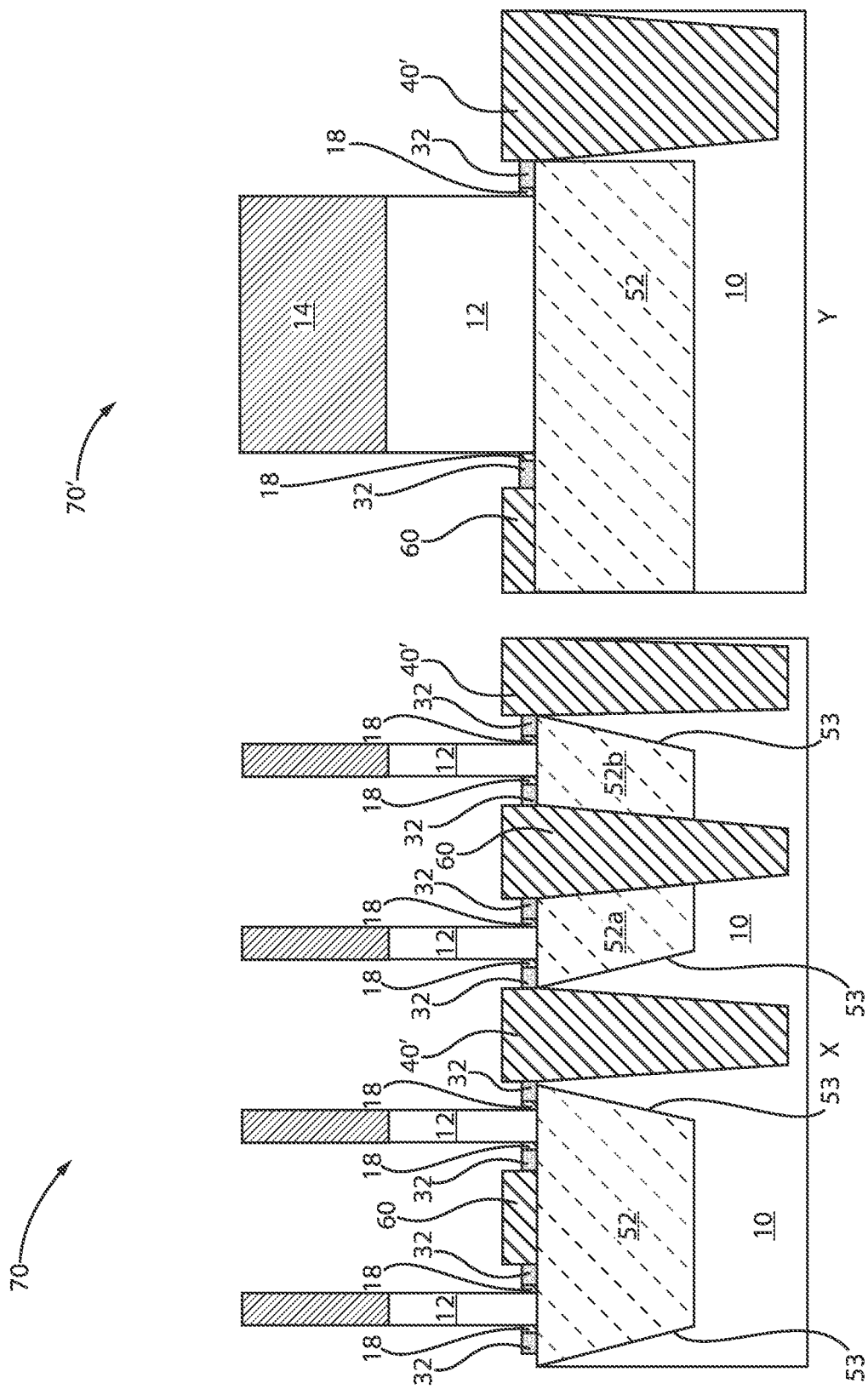
FIG. 11 is a cross-sectional view of the semiconductor structure of FIG. 10 where the self-aligned spacers are removed to expose the plurality of fins, in accordance with an embodiment of the present invention.

FIG. 11 is a cross-sectional view of the semiconductor structure of FIG. 10 where the self-aligned spacers are removed to expose the plurality of fins, in accordance with an embodiment of the present invention.

In various example embodiments, the self-aligned spacers 30 and the liners 18 are removed to expose the plurality of fins 12, as well as the bottom spacers 32. However, liner portions 18 remain directly between the bottom spacers 32 and bottom portions of the fins 12. The bottom epi regions 52 are directly underneath the fins 12. The bottom epi regions 52 directly contact the bottom surface of the fins 12. The bottom epi regions 52 can include slanted or sloped or angled or inclined surfaces 53. The sidewall edge 53 of the bottom epi 52 has a symmetric tapered profile (left-hand side). In contrast, after epi formation under a 2 fin device (or twin-fin structure), if there is additional patterning to form a single fin device, then the epi shape is asymmetric (right-hand side), and, thus, a taper angle of side wall 53 on each side of 52A or 52B is different. In other words, the second set of fins, on the right-hand side, are split by the STI region 40' and include separate and distinct epitaxial sections 52A, 52B. These epitaxial sections 52A, 52B now have an asymmetric shape as a result of the split. Stated differently, as noted above, the Si cavity shape and epi shape under the twin fins is symmetric. However, when additional patterning takes place between the two fins, then the symmetric epi under the twin fin will be etched, and an asymmetric epi shape (52A, 52B) is created.

The fins 12 thus include bottom spacers 32 on opposed ends thereof, the bottom spacers 32 separated by dielectric 60. The bottom epi regions 52 directly contact the fins 12, the bottom spacers 32, and the dielectric 60. The dielectric 60 extends above a top surface of the bottom spacers 32. The bottom epi regions 52 are separated by the ILD sections 40', that can also be referred to as shallow trench isolation (STI) regions. The bottom spacers 32 are uniform and the bottom epi 52 is directly underneath the channel fin. Also, the bottom epi regions 52 are defined by self-aligned RX patterning, followed by ILD deposition and recess, and then OPL ash. RX patterning is a lithography mask which defines where the active region is.

As a result, final structures 70, 70' are illustrated where a first set of fins directly contacts an epitaxial region defining a symmetric tapered shape and a second set of fins is split by an STI region (into single fin devices) and each single fin device directly contacts an epitaxial region defining an asymmetric tapered shape.

In summary, the exemplary embodiments of the present invention pertain to a method and structure for employing self-aligned RX patterning and STI as an anchor so that the substrate below the fin channel can be laterally etched or recessed and bottom epi regions are formed directly under the fin channel. The structure of the exemplary embodiments of the present invention includes a vertical transistor with at least one fin device, a bottom epi formed directly under the fin channel, where a sidewall edge of the bottom epi has a symmetric tapered profile. The method of the exemplary embodiments of the present invention includes forming vertical fins to define the active channels, forming a mask layer to protect the fins and opening the mask at least in alternative FIN-2-FIN space and etching into the substrate to form cavities to define the isolation region between the fin pairs. The method further includes filling the trench cavities and FIN-2-FIN space above with a dielectric, removing the mask layer to expose the substrate for each fin pair, forming lateral cavities under the fin pair, growing bottom source/drain (S/D) epi, and performing additional patterning to break the fin pair into two single fin devices such that the bottom epi has an asymmetric tapered profile.

Regarding FIGS. 1-11, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a self-aligned bottom spacer epi last flow for vertical transport field effect transistors (VTFETs) (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure for forming a vertical transport field effect transistor (VTFET), the semiconductor structure comprising:
    a bottom surface of a twin-fin structure directly contacting a top surface of a first epitaxial region; and
    a bottom surface of single fin structures each directly contacting respective top surfaces of second epitaxial regions, the single fin structures positioned on a central portion of the top surface of the second epitaxial regions;
    wherein the first epitaxial region defines a symmetric tapered shaped within a substrate and the second epitaxial regions each define an asymmetric tapered shape within the substrate.

2. The semiconductor structure of claim 1, wherein bottom spacers directly contact top surfaces of the first and second epitaxial regions.

3. The semiconductor structure of claim 1, wherein the first and second epitaxial regions are defined directly underneath fin channels.

4. The semiconductor structure of claim 1, wherein a liner section is disposed between bottom spacers and the fin structures.

5. The semiconductor structure of claim 1, wherein bottom spacers are vertically aligned with the first and second epitaxial regions.

6. The semiconductor structure of claim 1, wherein a shallow trench isolation (STI) region separates the twin-fin structure from the single fin structures.

7. The semiconductor structure of claim 6, wherein the STI region extends below bottom surfaces of the first and second epitaxial regions.

8. The semiconductor structure of claim 6, wherein a portion of opposed sidewalls of the STI region directly contact sidewalls of bottom spacers.

9. The semiconductor structure of claim 1, wherein the single fin structures are separated by a dielectric extending into the substrate.

10. The semiconductor structure of claim 9, wherein the second epitaxial regions directly contact sidewalls of the dielectric.

11. A semiconductor structure for forming a vertical transport field effect transistor (VTFET), the semiconductor structure comprising:
    a bottom surface of a twin-fin structure directly contacting a top surface of a first epitaxial region; and
    a bottom surface of single fin structures each directly contacting top surfaces of respective second epitaxial regions, the single fin structures positioned on a central portion of the top surface of the second epitaxial regions;
    wherein the first epitaxial region defines a first tapered shaped and the second epitaxial regions each define a second tapered shape within a substrate.

12. The semiconductor structure of claim 11, wherein the first tapered shape is symmetrical and each of the second tapered shapes is asymmetrical.

13. The semiconductor structure of claim 11, wherein bottom spacers directly contact top surfaces of the first and second epitaxial regions.

14. The semiconductor structure of claim 13, wherein a liner section is disposed between the bottom spacers and the fin structures.

15. The semiconductor structure of claim 13, wherein the bottom spacers are vertically aligned with the first and second epitaxial regions.

16. The semiconductor structure of claim 11, wherein the first and second epitaxial regions are defined directly underneath fin channels.

17. The semiconductor structure of claim 11, wherein a shallow trench isolation (STI) region separates the twin-fin structure from the single fin structures.

18. The semiconductor structure of claim 17, wherein the STI region extends below bottom surfaces of the first and second epitaxial regions.

19. The semiconductor structure of claim 11, wherein the single fin structures are separated by a dielectric extending into the substrate.

20. The semiconductor structure of claim 19, wherein the second epitaxial regions directly contact sidewalls of the dielectric.

* * * * *